US012378660B2

(12) United States Patent
Zeng et al.

(10) Patent No.: US 12,378,660 B2
(45) Date of Patent: Aug. 5, 2025

(54) PULSED LASER DEPOSITION METHOD

(71) Applicants: Chongqing Huapu Information Technology Co., Ltd., Chongqing (CN); Chongqing Huapu Quantum Technology Co., Ltd., Chongqing (CN); Chongqing Huapu New Energy Co., Ltd., Chongqing (CN); Chongqing Menghe Biotechnology Co., Ltd., Chongqing (CN); Yunnan Huapu quantum Material Co., Ltd, Yunnan (CN); ROI Optoelectronics Technology CO, LTD., Shanghai (CN); GuangDong ROI Optoelectronics Technology Co., Ltd., Guangdong (CN); Chongqing Institute of East China Normal University, Chongqing (CN); East China Normal University, Shanghai (CN)

(72) Inventors: Heping Zeng, Chongqing (CN); Mengyun Hu, Chongqing (CN); Yu Qiao, Chongqing (CN)

(73) Assignees: CHONGQING HUAPU INFORMATION TECHNOLOGY CO., LTD., Chongqing (CN); CHONGQING HUAPU QUANTUM TECHNOLOGY CO., LTD., Chongqing (CN); CHONGQING HUAPU NEW ENERGY CO., LTD., Chongqing (CN); CHONGQING MENGHE BIOTECHNOLOGY CO., LTD., Chongqing (CN); YUNNAN HUAPU QUANTUM MATERIAL CO., LTD, Yunnan (CN); ROI OPTOELECTRONICS TECHNOLOGY CO, LTD., Shanghai (CN); GUANGDONG ROI OPTOELECTRONICS TECHNOLOGY CO., LTD., Guangdong (CN); CHONGQING INSTITUTE OF EAST CHINA NORMAL UNIVERSITY, Chongqing (CN); EAST CHINA NORMAL UNIVERSITY, Shanghai (CN)

( * ) Notice: Subject to any disclaimer, the term of this patent is extended or adjusted under 35 U.S.C. 154(b) by 0 days.

(21) Appl. No.: 18/516,292

(22) Filed: Nov. 21, 2023

(65) Prior Publication Data
US 2024/0175118 A1    May 30, 2024

(30) Foreign Application Priority Data

Nov. 28, 2022  (CN) ........................ 202211504194. X

(51) Int. Cl.
C23C 14/28    (2006.01)
C23C 14/54    (2006.01)

(52) U.S. Cl.
CPC ............ *C23C 14/28* (2013.01); *C23C 14/542* (2013.01)

(58) Field of Classification Search
None
See application file for complete search history.

(56) References Cited

U.S. PATENT DOCUMENTS

2021/0323814 A1* 10/2021 Zeng .................... B81C 1/00531
2021/0325581 A1* 10/2021 Zeng .................... G03F 7/2053

* cited by examiner

Primary Examiner — Shamim Ahmed
Assistant Examiner — Bradford M Gates
(74) Attorney, Agent, or Firm — Hodgson Russ LLP

(57) ABSTRACT

A pulsed laser deposition method is provided. The method includes emitting a plurality of groups of femtosecond pulses, focusing the plurality of groups of femtosecond (Continued)

pulses into a plurality of groups of femtosecond filaments by lenses, and cross-coupling the plurality of groups of femtosecond filaments to form n beams of plasma gratings; exciting a target material by using a first plasma grating; and adjusting angles of the lenses and time delay between a plurality of beams of femtosecond pulses; coupling and splicing a second plasma grating with the first plasma grating along a grating pattern of the first plasma grating, until a $n^{th}$ plasma grating is coupled and spliced with a $(n-1)^{th}$ plasma grating along a grating pattern of the $(n-1)^{th}$ plasma grating to form a plasma grating channel; and exciting the target material by using the plasma grating channel to complete deposition on a substrate.

9 Claims, 3 Drawing Sheets

PULSED LASER DEPOSITION METHOD

CROSS-REFERENCE TO RELATED APPLICATION

This application claims priority to Chinese Patent Application No. 202211504194.X, filed Nov. 29, 2022, the entire disclosure of which is incorporated herein by reference.

FIELD

The present disclosure relates to the technical field of pulsed laser deposition, and more particularly to a plasma channel guided pulse laser deposition method.

BACKGROUND

A pulsed laser deposition technology is a deposition technology based on pulsed laser. This technology uses high-energy pulsed laser to excite a target material, deposit a plasma generated by the excitation on a target substrate, and form a film. A traditional pulsed laser deposition technology usually uses nanosecond pulsed laser, picosecond pulsed laser, and femtosecond pulsed laser as laser sources. Compared with deposition technologies such as electroplating, chemical corrosion and heat treatment, the pulsed laser deposition technology has advantages of simple process, wide application range, low temperature requirements, and good controllability, so it is widely used to prepare high-quality superconducting films, various nitride films, complex multicomponent oxide films, ferroelectric films, nonlinear waveguide films, etc.

In recent years, with the development of science and technology, requirements for the pulsed laser deposition technology are getting higher and higher. Using traditional nanosecond, picosecond and femtosecond pulsed laser as light sources has been unable to meet requirements for an optical power density and temperature when depositing on certain special materials. To solve this problem, a typical improvement method is to use femtosecond filaments as an excitation source. The femtosecond filament refers to the phenomenon of a long and stable plasma channel that appears due to the balance of the Kerr self-focusing effect and the plasma defocusing effect when an energy of the femtosecond pulsed laser is higher than a certain threshold when propagating in a medium. To further improve the optical power density when exciting the target material, two femtosecond filaments can be coupled to form a plasma grating. The plasma grating refers to plasma channels periodically arranged in space that occurs when two or three femtosecond pulsed filaments are cross-coupled. When the two femtosecond filaments are cross-coupled, longitudinal plasma grating stripes with alternating light and dark are formed, which is referred to as a one-dimensional plasma grating. When the three femtosecond filaments are cross-coupled, horizontal and longitudinal plasma grating stripes with alternating light and dark are formed, which is referred to as a two-dimensional plasma grating. Using plasma gratings to excite the target material can greatly increase an optical power density and a plasma density in a plasma channel obtained by excitation, reduce the size of plasma cluster in the plasma channel and improve the film quality.

Although using the plasma gratings to excite the target material can greatly increase the optical power density and the plasma density in the plasma channel, an injection distance of the target material is limited after the plasma gratings excite a sample. Therefore, it is impossible to guide an injection direction, and there are still large particles in an injected target material plasma, which reduces the applicability of plasma grating deposition. Therefore, it is urgent to develop a technology that can increase the injection distance of the plasma grating, guide the injection direction of the plasma and further reduce excited plasma clusters.

SUMMARY

The present disclosure provide a plasma channel guided pulsed laser deposition method. The method includes emitting a plurality of groups of femtosecond pulses, focusing the plurality of groups of femtosecond pulses into a plurality of groups of femtosecond filaments by lenses, and cross-coupling the plurality of groups of femtosecond filaments to form n beams of one-dimensional or two-dimensional plasma gratings, where n is a natural number greater than 1, in which each group of femtosecond pulses includes two or three beams of femtosecond pulses: exciting a target material by using a first plasma grating in the n beams of one-dimensional or two-dimensional plasma gratings as a pre-pulse: and adjusting angles of the lenses and time delay between a plurality of beams of femtosecond pulses: coupling and splicing a second plasma grating in the n beams of one-dimensional or two-dimensional plasma gratings with the first plasma grating along a grating pattern of the first plasma grating, and successively coupling and splicing a third plasma grating in the n beams of one-dimensional or two-dimensional plasma gratings with the second plasma grating along a grating pattern of the second plasma grating until a $n^{th}$ plasma grating is coupled and spliced with a $(n-1)^{th}$ plasma grating along a grating pattern of the $(n-1)^{th}$ plasma grating to form a plasma grating channel: and exciting the target material by using the plasma grating channel to complete deposition on a substrate.

DETAILED DESCRIPTION

Figure 1:
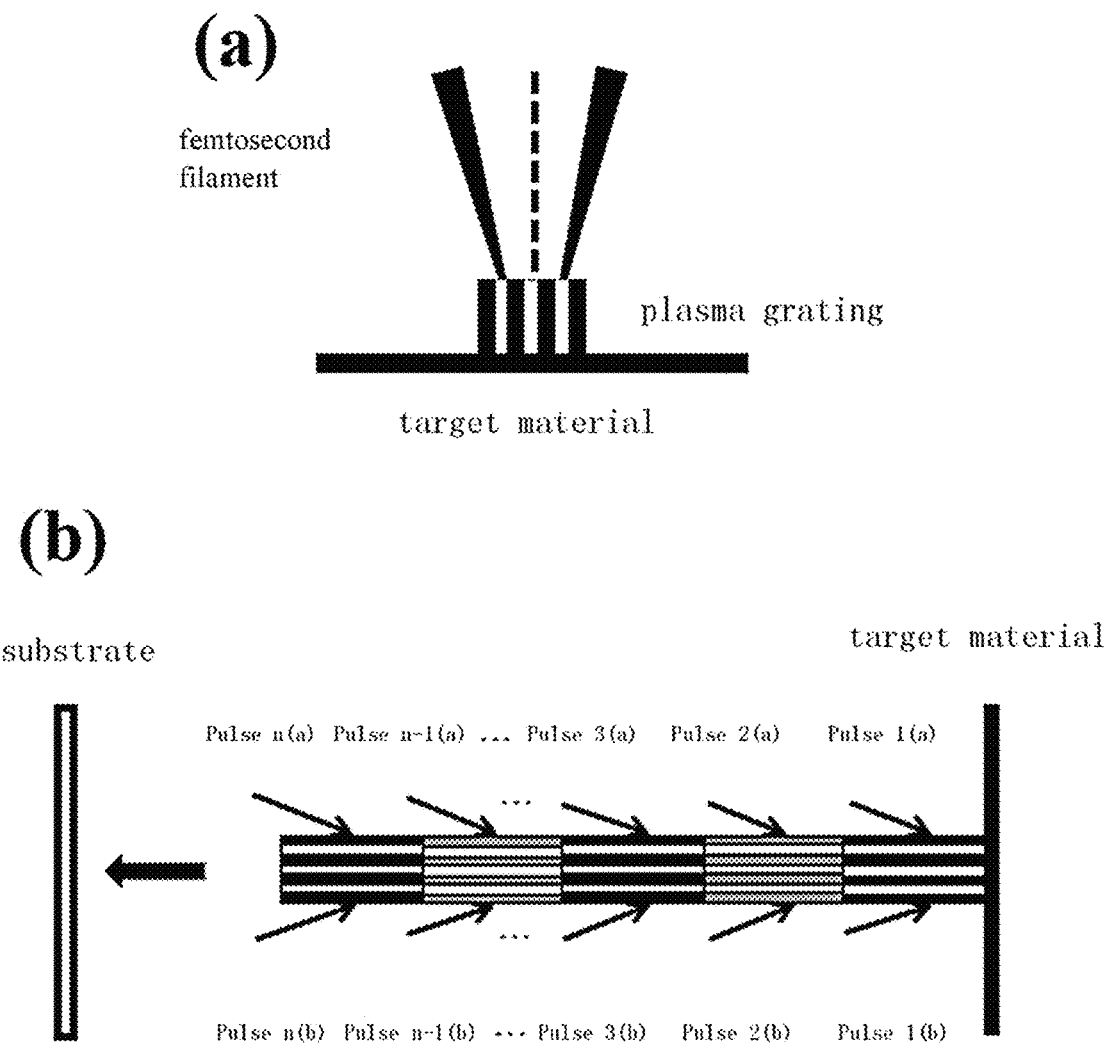
FIG. 1 is a schematic diagram of forming a plasma grating and a plasma channel in an embodiment of the present disclosure.

The following will be further described in detail through specific embodiments, but embodiments of the present disclosure are not limited thereto. Unless otherwise specified, the technical means used in the following embodiments are conventional means well known to those skilled in the art, experimental methods used are all conventional methods, and materials, reagents, etc. used can be obtained from commercial sources.

Reference numerals in accompanying drawings of the specification include a femtosecond pulsed laser 1, a substrate platform 2, a target material 3, mirrors I 4 to 7 and 16 to 19, mirrors II 8 to 11 and 20 to 23, and focusing lenses 12 to 15 and 24 to 27.

The present disclosure aims to provide a plasma channel guided pulse laser deposition method, so as to solve problems in existing pulsed laser deposition technologies that an injection direction of a target material cannot be guided and an injection distance is relatively short when a plasma grating excites a target material.

A plasma channel guided pulse laser deposition method includes steps as follows.

In step 1, a plurality of groups of femtosecond pulses are emitted, the plurality of groups of femtosecond pulses are focused into a plurality of groups of femtosecond filaments by a lens, and the plurality of groups of femtosecond filaments are cross-coupled to form a plurality of beams of one-dimensional or two-dimensional plasma gratings, in which each group of femtosecond pulses includes two or three beams of femtosecond pulses.

In step 2, a sample is excited by using one beam of plasma grating in the plurality of beams of one-dimensional or two-dimensional plasma gratings.

In step 3, by adjusting angles of the lenses and time delay between a plurality of beams of femtosecond pulses, remaining beams of plasma grating in the plurality of beams of one-dimensional or two-dimensional plasma gratings are coupled and spliced with the one beam of plasma grating to form a longer plasma grating channel, so as to guide a direction of target material evaporation and complete deposition on a substrate.

Principles and advantages of the embodiment are as follows. In practical application, the size of plasma lattice induced by femtosecond laser is relatively short, which will lead to shortcomings of a short injection distance and a fixed injection direction in practical application, which restricts application scenarios. In the embodiment, aiming at problems that in the prior art the injection direction of the target material cannot be guided and the injection distance is relatively short when the plasma grating excites the target material, the applicant has optimized an existing pulsed laser deposition technology, and provided a plasma grating splicing method for the first time. Based on a femtosecond pulsed laser plasma channel guiding technology in ultrafast optics, a longer plasma grating channel is formed by coupling and splicing a plurality of beams of plasma gratings. A direction of the target material evaporation can be guided by changing a splicing direction of two or more beams of plasma gratings, and then the injection direction of an excited target material can be guided. The plurality of beams of plasma gratings can continuously excite target material vapor, so that formed plasma particles are smaller, which is helpful for preparing a flat and uniform film. In addition, crystals on surfaces of films grown by this method can reach nanometer scale and can be deposited at room temperature.

In the embodiment, the plasma grating is used to excite the target material, and a high optical power density of the plasma grating can excite the target material vapor into smaller particles, which increases the flatness and compactness of the film.

In the embodiment, the plurality of beams of plasma gratings are spliced and coupled along the grating patterns of the plasma gratings to form a longer plasma grating channel to guide the direction of the target material vapor, and in the process of guiding the target material vapor, the plasma grating channel continuously excites and dissociates target material particles, so that more target material particles are in excited states, thus further increasing the compactness and flatness of a deposited film.

In the embodiment, the target material vapor is guided by the plasma grating channel, and the excited plasma presents a periodically distributed diffusion form under the guidance of the plasma channel, which is helpful to the deposition of microstructures.

In some embodiments, the femtosecond pulses have a laser energy of more than 0.5 mJ, a repetition frequency of 1 Hz to 1 MHz, and a pulse width of 5 to 1000 fs.

In the embodiment, an energy of femtosecond laser has an important influence on an excitation efficiency and an excitation effect. A single pulse energy of femtosecond laser must be high enough to form the plasma grating, and show the superiority of the plasma grating. The deposition effect is not obvious under the condition of low energy, and when the single pulse energy is lower than 0.5 mJ, the filament cannot be generated, so the plasma grating cannot be formed. The repetition frequency is related to the efficiency of large area deposition. The higher the repetition frequency, i.e., the greater the number of pulses per unit time, the faster the scanning deposition can be realized by increasing a sample moving speed. The femtosecond pulse width is also related to the formation of the plasma grating. In general, the formation of the plasma grating is based the optical power density, that is, the laser energy divided by the pulse width and then divided by a spot area. The larger this value, the more helpful it is to form the plasma grating. Therefore, a pulse with a long pulse width needs a higher laser energy to form the plasma grating, and the corresponding deposition effect is also difficult to achieve the situation of a short pulse. A central wavelength of laser is related to a photon energy. The shorter the wavelength, the greater the photon energy, and the stronger its ability to ionize and excite the target material. A single pulse energy of femtosecond laser output by a femtosecond laser after beam splitting is more than 0.5 mJ, so as to ensure the formation of the femtosecond filament and further ensure the deposition effect. In practical application, the laser energy of the femtosecond pulses can be more than 2 mJ, more than 10 mJ, more than 50 mJ, more than 100 mJ or a combination thereof. The repetition frequency can be 100 Hz to 0.8 MHZ, 600 Hz to 0.6 MHZ, 2 kHz to 0.4 MHz, 100 kHz to 0.5 MHz or a combination thereof. The pulse width can be 5 to 1000 fs, 100 to 750 fs, 260 to 570 fs, 345 to 456 fs or a combination thereof.

In some embodiments, an included angle between pulses in each group of femtosecond pulses is 5 to 20°, and included angles between pulses and the plasma grating channel are equal.

A stripe spacing of the plasma grating is one of the key factors affecting the effect of the embodiment. The stripe spacing of the plasma grating is specifically controlled by the included angle between two beams of femtosecond pulses forming the plasma grating. In the embodiment, the included angles between the pulses is small. After a plurality of beams of the femtosecond pulses pass through focusing lenses, a plurality of beams of femtosecond filament are formed and intersect at a small angle, and an interaction occurs in an overlapping area. Further, by adjusting an optical path difference between the femtosecond filaments to achieve complete synchronization in time, optical fields of the femtosecond filaments will interfere with each other, and plasma grating channels periodically arranged in space will be generated in an intersection area of a plurality of beams of the femtosecond filament. In practical application, the included angle between pulses in each group of femtosecond pulses can be 7 to 17°, 11 to 15°, 13 to 14°, or a combination thereof.

In some embodiments, an optical power density of the plasma grating is 8 to $12 \times 10^{13}$ W/cm$^2$.

In the embodiment, the optical power density in each beam of plasma gratings can be regulated by changing the energy of the femtosecond pulse group, and the optical power density of the plasma grating is within an appropriate range verified by experiments.

In some embodiments, a distance between the target material and the substrate is 2 to 5 mm.

In the embodiment, the distance between the target material and the substrate has a critical influence on the deposition effect. In the embodiment, an excitation time and an excitation path are prolonged by using the plasma grating channel, so that film deposition can be formed between the substrate and the target material at a slightly larger distance. In addition, the target material particles can be uniformly deposited with a small particle size, thus ensuring the uniformity of the film. However, since a distance between the plasma gratings is still limited, when the distance between the substrate and the target material is too large, the excited target material will not be bale to deposit on the substrate. The above-mentioned distance is a suitable distance range verified by practice. In practical application, the distance between the target material and the substrate can be 2.5 mm to 4.5 mm, 3 mm to 4 mm, or a combination thereof.

In some embodiments, the time delay between femtosecond pulses is 50 to 100 ps.

In the embodiment, the time delay between the femtosecond pulses has a very critical influence on a coupling effect. By reasonably controlling the time delay, a coupling and splicing effect of the plasma grating channel can be ensured, and the excitation path can be extended as much as possible. In practical application, the time delay between the femtosecond pulses can be 60 to 90 ps, 70 to 85 ps, 75 to 80 ps, or a combination thereof.

In some embodiments, pulse delay between plasma gratings is 0 to 20 ps.

In the embodiment, by limiting the pulse delay between the plasma gratings, a plasma excited by the plasma grating is still in the process of expansion when the time delay is about 20 ps. Coupling a beam of plasma gratings before that can prolong the excitation time and the plasma grating. In practical application, the pulse delay between the plasma gratings can specifically be 2 to 18 ps, 5 to 15 ps, 8 to 12 ps, 10 to 11 ps, or a combination thereof.

In some embodiments, the plasma gratings are coupled and spliced in such a way that two adjacent plasma gratings are coupled and spliced along grating stripes of each other to form the plasma grating channel.

In the embodiment, when the plasma grating channel is formed, firstly, a first group of femtosecond pulses are cross-coupled to form a plasma grating I to excite the target material. Then, a second group of femtosecond pulses are cross-coupled along a path of the plasma grating I to form a plasma grating II, and the plasma grating II is coupled and spliced with the plasma grating I along a grating pattern of the plasma grating I to form a longer plasma grating channel. A third group of femtosecond pulses are cross-coupled along a path of the plasma grating II to form a plasma grating III, and the plasma grating III is coupled and spliced with the plasma grating II along a grating pattern of the plasma grating II to form a longer plasma grating channel, and so on to form a longer spliced plasma grating channel.

In some embodiments, the deposition is completed by using a pulsed laser deposition apparatus, in which the pulsed laser deposition apparatus includes a femtosecond pulsed laser configured to emit laser, a target material platform, on which the target material is placed, a substrate platform, on which the substrate is placed, and a plurality of mirrors and a plurality of focusing lenses configured for time delay.

In the embodiment, the femtosecond pulsed laser is configured to emit femtosecond pulses. When in use, the target material is placed on the target material platform, and the substrate is placed on the substrate platform, respectively. After emitted femtosecond pulses are delayed and synchronized by the mirrors, a plasma grating is formed and the target material is excited.

As shown in FIG. 1(a), FIG. 1(a) is a schematic diagram of coupling two femtosecond filaments to form a plasma grating. During processing, a target material is placed in parallel with a glass substrate, and a distance between the target material and the glass substrate is greater than 2 mm. The two femtosecond filaments are cross-coupled on a surface of the target material to form a plasma grating to excite target material vapor. The two femtosecond filaments are symmetrically incident relative to the surface of the target material, and a particle size of the target material vapor can be greatly reduced by using the plasma grating to excite the target material.

As shown in FIG. 1(b), FIG. 1(b) is a schematic diagram of a principle of a plasma channel guided pulse laser deposition method. Firstly, a pulse 1(a) and a pulse 1(b) are symmetrically incident at a same angle relative to the target material, and the pulse 1(a) and the pulse 1(b) are cross-coupled to form a plasma grating I to excite the target material vapor. Then, the pulse 2(a) and the pulse 2(b) are symmetrically incident at a same angle relative to the plasma grating I, the pulse 2(a) and the pulse 2(b) are cross-coupled to form a plasma grating II, and the plasma grating II are coupled and spliced with the plasma grating I, thus prolonging the plasma grating channel, guiding the target material vapor, and continuously exciting and dissociating the target material vapor. By analogy, a pulse 3(a) and a pulse 3(b) . . . a pulse n−1(a) and a pulse n−1(b), and a pulse n(a) and a pulse n(b) are symmetrically incident at a same angle relative to the plasma grating channel, respectively, and are cross-coupled and spliced to form a longer plasma grating channel, which guides the target material vapor to the substrate, continuously excites and dissociates the target material and deposits to form a film. In this process, a direction of the plasma grating channel can be changed by controlling the angles of the lenses, and an optical power density in the plasma grating can be changed by controlling an energy of the femtosecond pulse, so that the target material vapor has better directivity and particle selectivity. Since the plasma channel is formed by coupling and splicing the plurality of beams of the plasma gratings, and the target material undergoes continuous excitation and dissociation before reaching the substrate, particles of the target material vapor are smaller and can more be in excited states, and finally an effect of increasing the compactness and flatness of a deposited film is achieved.

Figure 2:
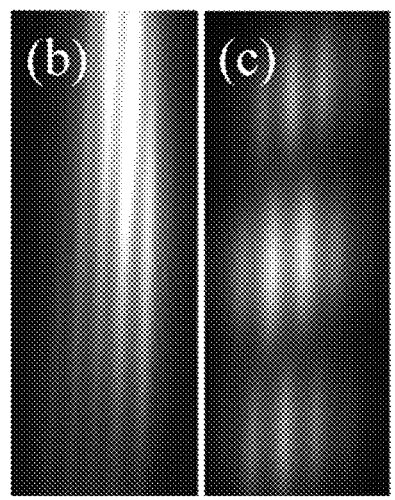
FIG. 2 is an imaging diagram of one-dimensional and two-dimensional plasma grating channels taken by an intensifier charge coupled device (ICCD).

FIG. 2(b) is an imaging diagram of a one-dimensional plasma grating taken by an intensifier charge coupled device (ICCD), and FIG. 2(c) is an imaging diagram of a two-dimensional plasma grating taken by an ICCD. The one-dimensional plasma grating appears as longitudinal grating stripes with alternating light and dark, and the two-dimensional plasma grating appears as horizontal and longitudinal grating stripes with alternating light and dark.

Figure 3:
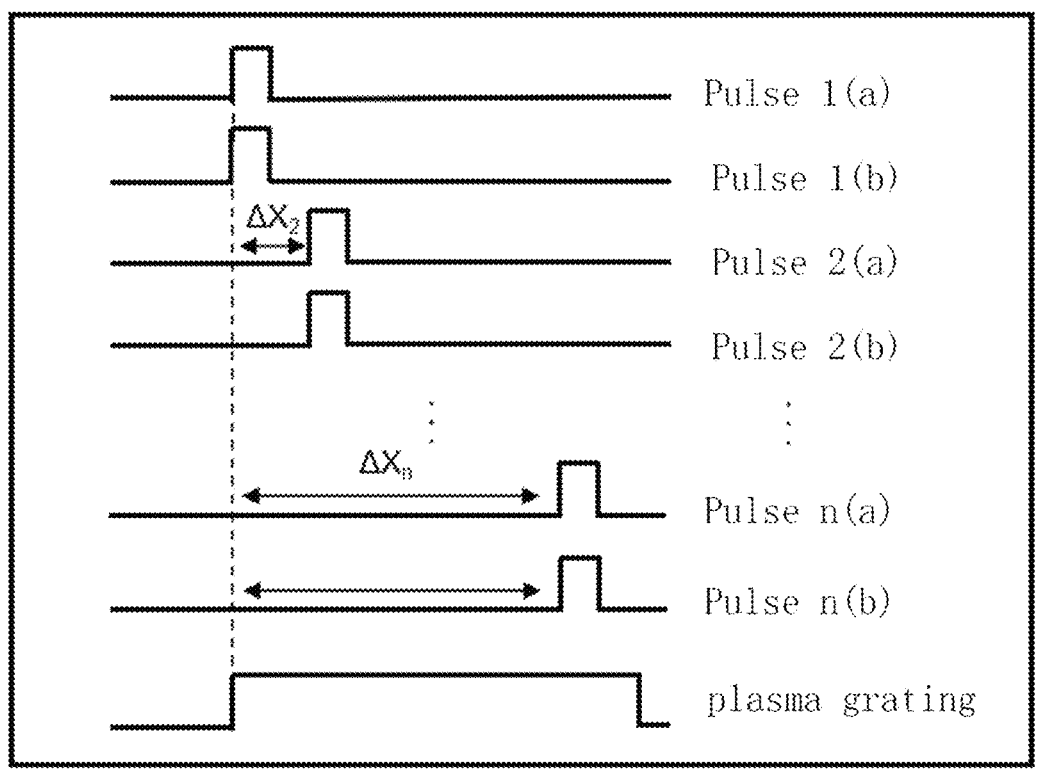
FIG. 3 is a structural diagram of a plasma grating channel formed by coupling and splicing a plurality of groups of femtosecond pulses.

As shown in FIG. 3, FIG. 3 is a structural diagram of a plurality of groups of femtosecond pulses coupled into a longer plasma grating channel. Each group of femtosecond pulse filaments is coupled to form a beam of femtosecond plasma gratings, and a distance between an intersection point of each group of femtosecond filaments and the target material is Δxn. Adjacent plasma gratings are coupled and spliced to form a longer plasma grating channel.

Figure 4:
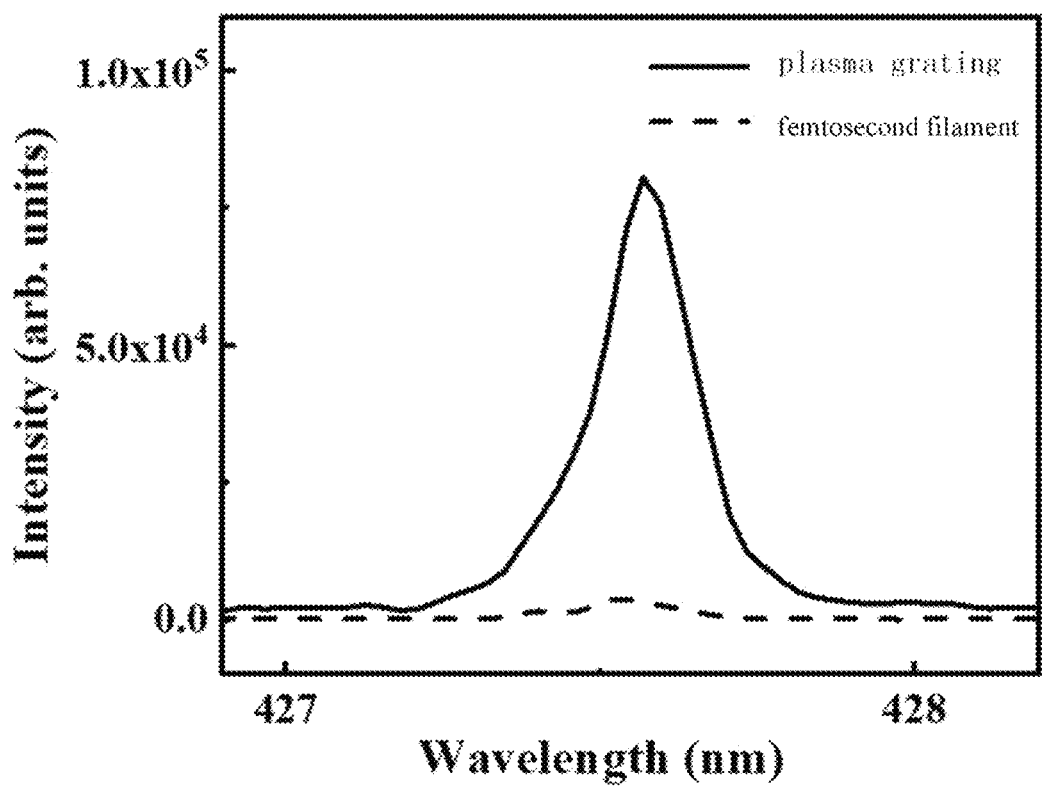
FIG. 4 is a comparison diagram of a spectral line signal intensity when a target material is excited by a plasma grating and a femtosecond filament.

As shown in FIG. 4, FIG. 4 is a comparison diagram of a spectral line signal intensity when a target material is excited by a plasma grating and a femtosecond filament. The spectral line intensity is measured by a spectrometer (Echelle spectrometer (Mechelle 5000, Andor Technology)). A solid line corresponds to the plasma grating, and a dotted line corresponds to the femtosecond filament. Since a length of a single beam of plasma grating is in the order of hundreds of microns, a spacing between coupling positions of each adjacent group of femtosecond pulses should be controlled to be less than hundreds of microns to connect two adjacent beams of plasma gratings.

Figure 5:
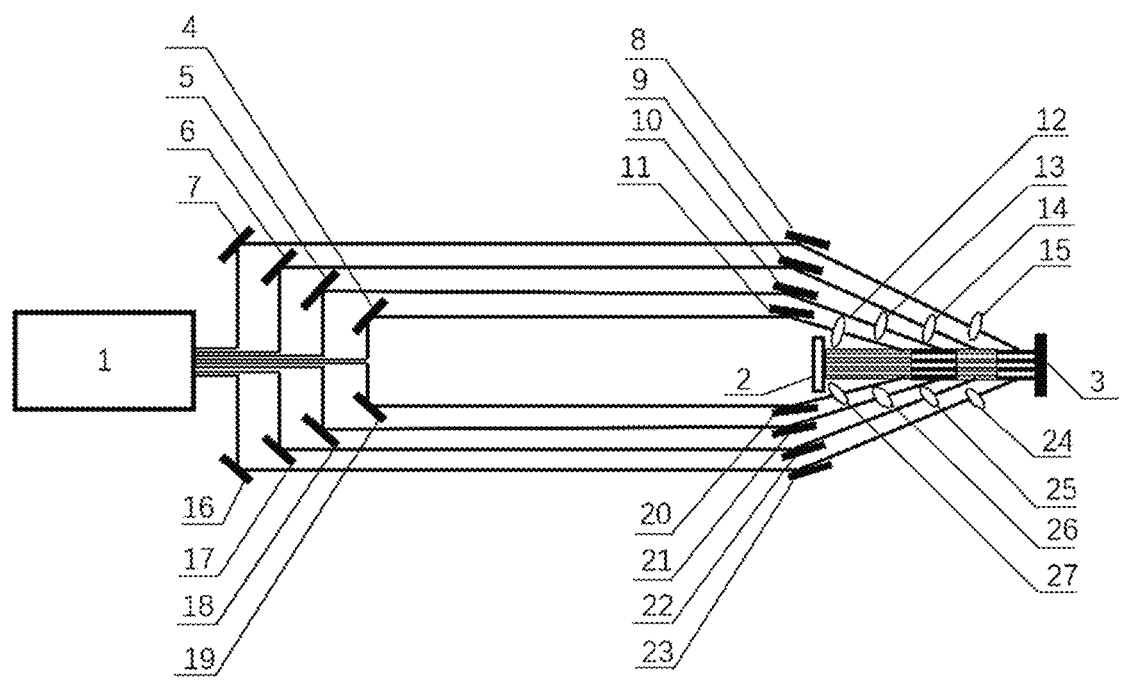
FIG. 5 is a schematic diagram of a plasma channel guided pulse laser deposition apparatus.

In an embodiment, a plasma channel guided pulse laser deposition method is completed based on a plasma channel guided pulse laser deposition apparatus. A structure of the plasma channel guided pulse laser deposition apparatus is shown in FIG. 5. The pulsed laser deposition apparatus includes a pulse laser 1, eight mirrors I, eight mirrors II, eight focusing lenses, a target material platform 3, and a substrate platform 2. The eight mirrors I are divided into four groups, two mirrors I in each group are arranged symmetrically, and longitudinal distances between mirror groups decreases sequentially from left to right. The eight mirrors II are also divided into four groups, two mirrors II in each group are arranged symmetrically, and longitudinal distances between mirror groups increases sequentially from left to right. The eight focusing lenses are also divided into four groups, and two focusing lenses in each group are arranged symmetrically, and longitudinal distances between focusing lens groups increases sequentially from left to right. When in use, the pulse laser 1 generates eight beams of femtosecond pulsed laser with a pulse width of 45 fs, an energy of 0.7 mJ, and a central wavelength of 800 nm. The eight beams of femtosecond pulsed laser are focused into femtosecond filaments through the mirror I, the mirror II, and the focusing lens, respectively. Each group of two beams of femtosecond pulsed laser is a group, which is symmetrically incident and coupled, a total of four groups. Each group of two beams of femtosecond pulsed laser is a group, each group of femtosecond pulsed laser is cross-coupled to form a one-dimensional plasma grating, and four beams of plasma gratings formed by cross-coupling four groups of femtosecond pulses are on a same straight line. Firstly, a first group of femtosecond pulses are cross-coupled to form a plasma grating I to excite a target material. Then, a second group of femtosecond pulses are cross-coupled along a path of the plasma grating I to form a plasma grating II, and the plasma grating II are coupled and spliced with the plasma grating I along a grating pattern of the plasma grating I to form a longer plasma grating channel. A third group of femtosecond pulses are cross-coupled along a path of the plasma grating II to form a plasma grating III, and the plasma grating III are coupled and spliced with the plasma grating II along a grating pattern of the plasma grating II to form a longer plasma grating channel. A fourth group of femtosecond pulses are cross-coupled along a path of plasma grating III to form a plasma grating IV, and the plasma grating IV are coupled and spliced with the plasma grating III along a grating pattern of the plasma grating III to form a longer plasma grating channel. The plasma gratings I to IV are coupled and spliced to form a longer plasma grating channel, which guides a direction of the plasma generated by the target material excited by the plasma grating I and continues to excite and dissociate. After diffusion and cooling, the plasma is finally deposited on a glass substrate to form a film.

Large area deposition can be realized by moving the target material platform and the substrate platform for auxiliary excitation. When depositing, the target material platform and the substrate platform are moved at a constant speed, then a shutter is opened, and the target material is excited by a single beam plasma grating to generate plasma. Afterwards, the plasma is dissociated and guided by the plasma grating channel formed by coupling and splicing the plurality of beams of plasma gratings, and deposits on the substrate to complete the deposition. After completing the deposition, the shutter is closed firstly, and then the movement of the target material platform and the substrate platform is stopped.

Example 1

When depositing in a vacuum environment, SiC is used as a target material and a quartz glass is used as a substrate, and a distance between the target material and the substrate is 5 mm. A picosecond pulse laser outputs a beam of picosecond pulses with an energy of 50 mJ to excite the target material and generate target material vapor. A femtosecond pulsed laser outputs eight beams of femtosecond pulses. Four beams of femtosecond pulses in the eight beams of femtosecond pulses have an energy of 0.7 mJ, and the other four beams of femtosecond pulses in the eight beams of femtosecond pulses have an energy of 1 mJ. Each group of two beams of femtosecond pulsed laser with a same energy is a group, each group of femtosecond pulsed laser is cross-coupled to form a one-dimensional plasma grating, and four beams of plasma gratings formed by cross-coupling four groups of femtosecond pulses are on a same straight line. Firstly, two beams of femtosecond pulses with an energy of 0.7 mJ are cross-coupled at a same angle relative to picosecond pulses to form a plasma grating I, and a plasma excited by the picosecond pulses is re-excited. Then, two beams of femtosecond pulses with an energy of 1 mJ are cross-coupled along a path of picosecond pulses to form a plasma grating II, and the plasma grating II are coupled and spliced with the plasma grating I along a grating pattern of the plasma grating I to form a longer plasma grating channel. After that, two beams of femtosecond pulses with an energy of 0.7 mJ are cross-coupled along a path of picosecond pulses to form a plasma grating III, and the plasma grating III are coupled and spliced with the plasma grating II along a grating pattern of the plasma grating II to form a longer plasma grating channel. Finally, two beams of femtosecond pulses with an energy of 1 mJ are cross-coupled along a path of picosecond pulses to form a plasma grating IV, and the plasma grating IV are coupled and spliced with the plasma grating III along a grating pattern of the plasma grating III to form a longer plasma grating channel, so as to guide generated plasmas to be deposited on the quartz glass substrate to form a film. Time delay between four groups of femtosecond pulses is controlled to be 80 ps, so that the plasma grating channels formed by plasma gratings I to IV reaches an optimal excitation intensity. A moving speed between the substrate platform and the target material platform is set to be 50 mm/s, and a spacing corresponding to each pulse excitation point is 50 µm. After the substrate platform and the target material platform start to move, a shutter is opened for excitation. In a specific implementation, the moving speed between the substrate platform and the target material platform can be flexibly adjusted according to characteristics of different materials, which is not limited thereto. After the laser is excited, the shutter is closed, the movement of the substrate platform and the target material platform is stopped, and a SiC film is deposited on the substrate for 15 minutes.

Example 2

When depositing in an air environment, SiN is used as a target material, a quartz glass is used as a substrate, and a distance between the target material and the substrate is 5 mm. A femtosecond pulsed laser outputs nine beams of femtosecond pulses with an energy of 0.7 mJ. Each group of three beams of femtosecond pulsed laser is a group, each group of femtosecond pulsed laser is cross-coupled to form a two-dimensional plasma grating, and three beams of two-dimensional plasma gratings formed by coupling three groups of femtosecond pulsed laser are on a same straight line. Firstly, three femtosecond pulses with an energy of 0.7 mJ are cross-coupled at the target material to form a plasma grating I to excite the target material and generate target material vapor. Then, three femtosecond pulses with an energy of 0.7 mJ are cross-coupled along a path of the plasma grating I to form a plasma grating II, and the plasma grating II are coupled and spliced with the plasma grating I along a grating pattern of the plasma grating I to form a longer plasma grating channel. After that, three femtosecond pulses with an energy of 0.7 mJ are cross-coupled along a path of the plasma grating II to form a plasma grating III, and the plasma grating III are coupled and spliced with the plasma grating II along a grating pattern of the plasma grating II to form a longer plasma grating channel, so as to guide generated plasmas to be deposited on the quartz glass substrate to form a film. Time delay between three groups of femtosecond pulses is controlled to be 50 ps, so that the plasma grating channels formed by the plasma gratings I to III reaches an optimal excitation intensity. A moving speed between the substrate platform and the target material platform is set to be 20 mm/s, and a spacing corresponding to each pulse excitation point is 20 µm. After the substrate platform and the target material platform start to move, a shutter is opened for excitation. After the laser is excited, the shutter is closed, the movement of the substrate platform and the target material platform is stopped, and a SiN film is deposited on the substrate for 15 minutes.

What has been described above is merely an embodiment of the present disclosure, and common knowledge such as specific the embodiment and/or characteristics well known in the embodiment has not been described much here. It should be pointed out that for those skilled in the art, several modifications and improvements can be made without departing from the embodiment of the present disclosure, which should also be regarded as the protection scope of the present disclosure, and will not affect the implementation effect of the present disclosure and utility of the patent. The scope of protection required by the present disclosure shall be based on the contents of the claims, and records such as a specific implementation in the specification can be used to explain the contents of the claims.

What is claimed is:

1. A pulsed laser deposition method, comprising:
   emitting a plurality of groups of femtosecond pulses, focusing the plurality of groups of femtosecond pulses into a plurality of groups of femtosecond filaments by lenses, and cross-coupling the plurality of groups of femtosecond filaments to form n beams of one-dimensional or two-dimensional plasma gratings, where n is a natural number greater than 1, wherein each group of femtosecond pulses comprises two or three beams of femtosecond pulses;
   exciting a target material by using a first plasma grating in the n beams of one-dimensional or two-dimensional plasma gratings as a pre-pulse; and
   adjusting angles of the lenses and time delay between a plurality of beams of femtosecond pulses: coupling and splicing a second plasma grating in the n beams of one-dimensional or two-dimensional plasma gratings with the first plasma grating along a grating pattern of the first plasma grating, and successively coupling and splicing a third plasma grating in the n beams of one-dimensional or two-dimensional plasma gratings with the second plasma grating along a grating pattern of the second plasma grating until a $n^{th}$ plasma grating is coupled and spliced with a $(n-1)^{th}$ plasma grating along a grating pattern of the $(n-1)^{th}$ plasma grating to form a plasma grating channel; and exciting the target material by using the plasma grating channel to complete deposition on a substrate.

2. The pulsed laser deposition method of claim 1, wherein the femtosecond pulses have a laser energy of more than 0.5 mJ, a repetition frequency of 1 Hz to 1 MHz, and a pulse width of 5 to 1000 fs.

3. The pulsed laser deposition method of claim 1, wherein an included angle between pulses in each group of femtosecond pulses is 5 to 20°, and included angles between pulses and the plasma grating channel are equal.

4. The pulsed laser deposition method of claim 3, wherein an optical power density of the plasma grating is 8 to $12 \times 10^{13}$ W/cm$^2$.

5. The pulsed laser deposition method of claim 1, wherein a distance between the target material and the substrate is 2 to 5 mm.

6. The pulsed laser deposition method of claim 5, wherein the time delay between femtosecond pulses is 50 to 100 ps.

7. The pulsed laser deposition method of claim 1, wherein pulse delay between plasma gratings is 0 to 20 ps.

8. The pulsed laser deposition method of claim 7, wherein the plasma gratings are coupled and spliced in such a way that two adjacent plasma gratings are coupled and spliced along grating stripes of each other to form the plasma grating channel.

9. The pulsed laser deposition method of claim 1, wherein the deposition is completed by using a pulsed laser deposition apparatus, wherein the pulsed laser deposition apparatus comprises:
   a femtosecond pulsed laser configured to emit laser;
   a target material platform, on which the target material is placed;
   a substrate platform, on which the substrate is placed; and
   a plurality of mirrors and a plurality of focusing lenses configured for time delay.

* * * * *